United States Patent
Seknicka (10) Patent No.: US 7,091,893 B2
(45) Date of Patent: Aug. 15, 2006

(54) LOUDSPEAKER CONTROL CIRCUIT

(75) Inventor: Otto Seknicka, Berndorf (AT)

(73) Assignee: AKG Acoustics GmbH (AT)

( * ) Notice: Subject to any disclaimer, the term of this patent is extended or adjusted under 35 U.S.C. 154(b) by 0 days.

(21) Appl. No.: 11/126,959

(22) Filed: May 10, 2005

(65) Prior Publication Data

US 2005/0270214 A1    Dec. 8, 2005

(30) Foreign Application Priority Data

May 11, 2004   (EP)   ................................. 04450105

(51) Int. Cl.
   *H03M 1/66*   (2006.01)
   *H04R 3/00*   (2006.01)

(52) U.S. Cl. ...................... 341/145; 381/111

(58) Field of Classification Search ................ 341/145, 341/143, 139, 118, 120, 144, 136, 150, 156; 330/10; 381/111, 150, 92; 375/238; 700/94
   See application file for complete search history.

(56) References Cited

U.S. PATENT DOCUMENTS

| | | | | |
|---|---|---|---|---|
| 4,198,622 A | * | 4/1980 | Connolly et al. | 341/145 |
| 4,311,988 A | * | 1/1982 | Kelley et al. | 341/145 |
| 4,503,421 A | * | 3/1985 | Hareyama et al. | 341/145 |
| 5,153,592 A | * | 10/1992 | Fairchild et al. | 341/118 |
| 5,323,159 A | * | 6/1994 | Imamura et al. | 341/145 |
| 5,572,211 A | * | 11/1996 | Erhart et al. | 341/144 |
| 5,909,496 A | * | 6/1999 | Kishigami et al. | 381/111 |
| 6,198,419 B1 | * | 3/2001 | Wen | 341/145 |
| 6,522,273 B1 | * | 2/2003 | Fei et al. | 341/139 |
| 6,683,494 B1 | * | 1/2004 | Stanley | 330/10 |
| 6,897,795 B1 | * | 5/2005 | Mallinson | 341/143 |

OTHER PUBLICATIONS

Amar Palacherla, "Using PWM to Generate Analog Output", 4pp., Microchip Technology, Inc., 1997, no month.
Dennis Bohn, "Digital Dharma of Audio A/D Converters", 10pp., RaneNote 137, Rane Corporation, 1997, no month.

* cited by examiner

*Primary Examiner*—Patrick Wamsley
(74) *Attorney, Agent, or Firm*—Brinks Hofer Gilson & Lione (57) ABSTRACT

A loudspeaker control circuit includes a bit splitter, a complement module and a digital-to-analog converter. The bit splitter divides a data item representing an acoustic signal into a high order bit group and a low order bit group. The complement module determines a complement of at least one of the high order bit group and the low order bit group. The complement module may be connected in series to the digital-to-analog converter. The digital-to-analog converter converts the high order bit group and the low order bit group from a digital format to an analog format.

28 Claims, 5 Drawing Sheets

LOUDSPEAKER CONTROL CIRCUIT

BACKGROUND OF THE INVENTION

1. Priority claim

This application claims the benefit of priority from European patent application No. 044 50105.4, filed May 11, 2004, which is incorporated herein in its entirety by this reference.

2. Technical Field

The invention relates to loudspeakers and in particular, loudspeaker control circuits.

3. Related Art

Loudspeakers may be used to reproduce analog audio signals. Audio signals recorded in a digital format may need to be converted into analog audio signals for reproduction by the loudspeakers. Digital-to-analog converters ("D/A converters") may be used to convert the digital signals to analog signals. Depending on sound applications, D/A converters with different resolutions may be used. Unsophisticated speech applications such as speech synthesis systems in toys may operate with low resolution D/A converters. Low resolution D/A converters, however, may not properly convert high frequency signals and any interfering signals. Reproduced audio signals with the low resolution D/A converters may be prone to distortions. Higher resolution D/A converters may be prohibitively expensive.

SUMMARY

A loudspeaker control circuit includes a bit splitter, a complement module and a digital analog converter ("D/A converter"). The bit splitter divides a data item into a high order bit group and a low order bit group. The data item represents an acoustic signal. The complement module operates to determine a complement of either of the high order bit group or the low order bit group, or both. The D/A converter operates to convert the high order bit group and the low order bit group from a digital format to an analog format.

An audio signal processing system includes a pre-conversion stage, a conversion stage and an output stage. The pre-conversion stage receives an input audio signal in a digital format. The conversion stage is operable to convert the input audio signal to an output audio signal in an analog format. The conversion stage includes a modulation stage, a weighting stage and a filtering stage. The modulation stage converts the input audio signal into a pulse stream having a variable average value. The weighting stage processes the pulse stream to be a weighted signal. The filtering stage eliminates a predetermined frequency range of the weighted signal. The output stage is operable to output the audio signal in the analog format.

A loudspeaker control method includes dividing a digital audio signal into a high order bit group and a low order bit group; determining a complement of either of the high order bit group or the low order bit group, or both; converting the complemented bit group and the remaining bit group to an analog signal; and applying the analog signal from the complemented bit group to a negative terminal of a loudspeaker capsule and the analog signal from the remaining bit group to a positive terminal of the loudspeaker capsule.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

A loudspeaker control circuit may include a digital-to-analog converter ("D/A converter") that converts the digital audio signals into the analog audio signals. The digital audio signals may be divided into bit groups prior to conversion. Either of the divided bit groups may be complemented with a complement module. Each bit group may be digitally modulated, processed to be weighted by a voltage divider, and filtered by a low pass filter. A resulting analog signal is provided to the loudspeaker.

Figure 1:
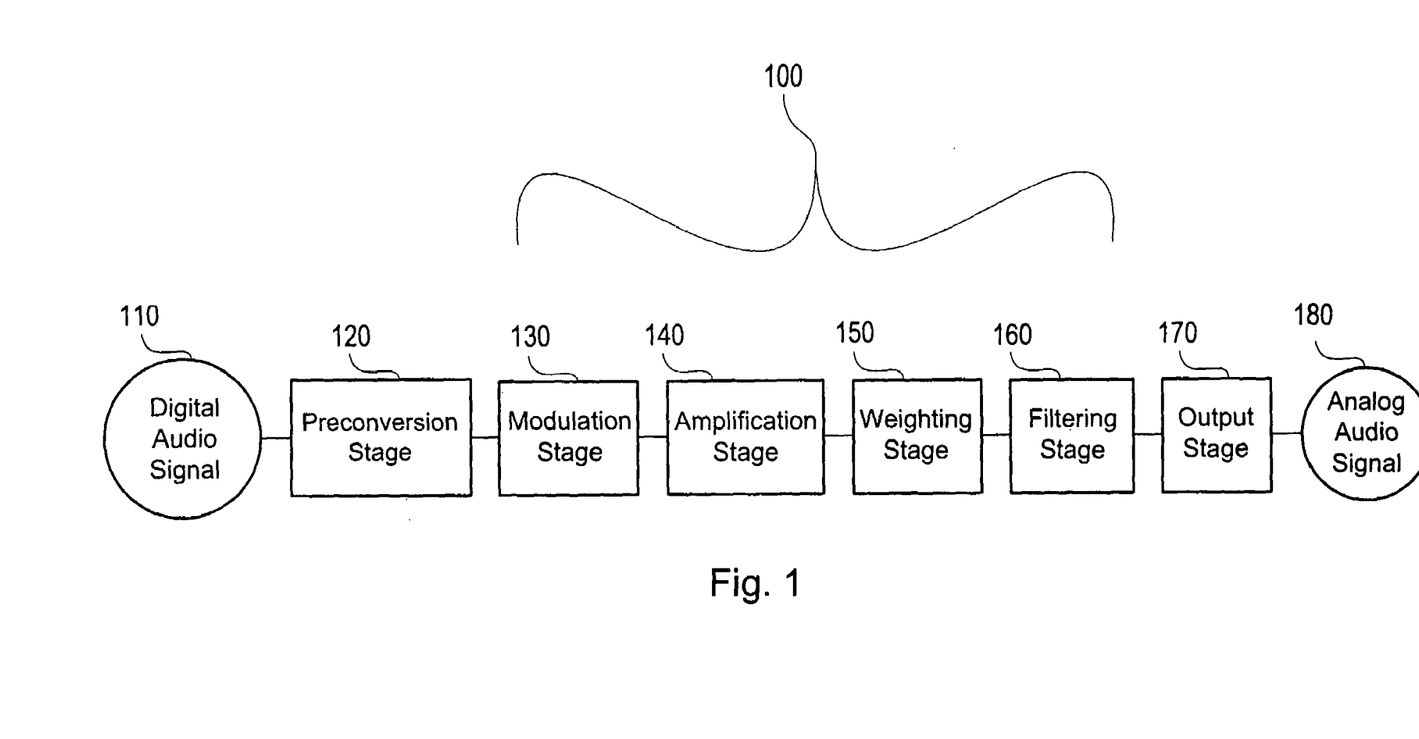
FIG. 1 is a flowchart illustrating audio signal processing.

FIG. 1 is a flowchart illustrating audio signal processing for use with a loudspeaker. A digital audio signal 110 is an input to a pre-conversion stage 120. The digital audio signal 110 may be recorded on a storage medium, such as compact disc, digital versatile disc, etc. The digital audio signal 110 may be represented with a multiple bit sequence such as 8 bits, 16 bits, etc. The pre-conversion stage 120 processes the digital audio signal 110 to be suitable for a subsequent conversion stage 100. The conversion stage 100 may include a modulation stage 130, an amplification stage 140, a weighting stage 150 and a filtering stage 160 in FIG. 1. More or fewer stages are possible in the conversion stage 100.

The pre-conversion stage 120 may include a serial-to-parallel converter, a bit splitter, a complement module, etc. The serial-to-parallel converter converts the serial format of the digital audio signal 110 to a parallel format. The bit splitter divides the digital audio signal 110 of the parallel format into two or more bit groups. The division of the digital audio signal 110 reduces a level of resolution required for the conversion stage 100. The complement module operates to complement the digital audio signal. The bit splitter, the complement module and the serial-to-parallel converter will be described in detail below in connection with FIGS. 2 and 3.

The modulation stage 130 receives the processed digital audio signal. The modulation stage 130 modulates the digital audio signal into a bit stream, so that an average value of the bit stream represents the binary amplitude of the digital audio signal. The amplification stage 140 increases the modulated signal to the level suitable for output at an output stage 170. The amplification stage 140 may also operate as a buffer stage to the modulated signal. The amplified signal is an input to the weighing stage 150. The weighting stage 150 processes the amplified signal to be a weighted signal. The signal may be weighted to reflect resolution of the original digital audio signal. The weighting stage 150 may apply to the amplified signal a power factor, such as a factor of 2. Other power factors may be used depending on the implementation. Powers correspond to a width of the digital audio signal. For instance, the amplified signal may be processed to be a weighted signal with a factor of $1/256$ where the original audio signal has an 8-bit sequence.

The weighted signal is filtered by the filtering stage 160. The filtering stage 160 may include a low pass filter that eliminates high frequency harmonics. The filtering stage 160 may be implemented with an analog circuit such as a capacitor and inductor. The filtered signal is output to the output stage 170. The output stage 170 includes the loudspeaker. As a result, the digital audio signal 110 is converted to the analog audio signal 180 through the conversion stage 100.

Figure 2:
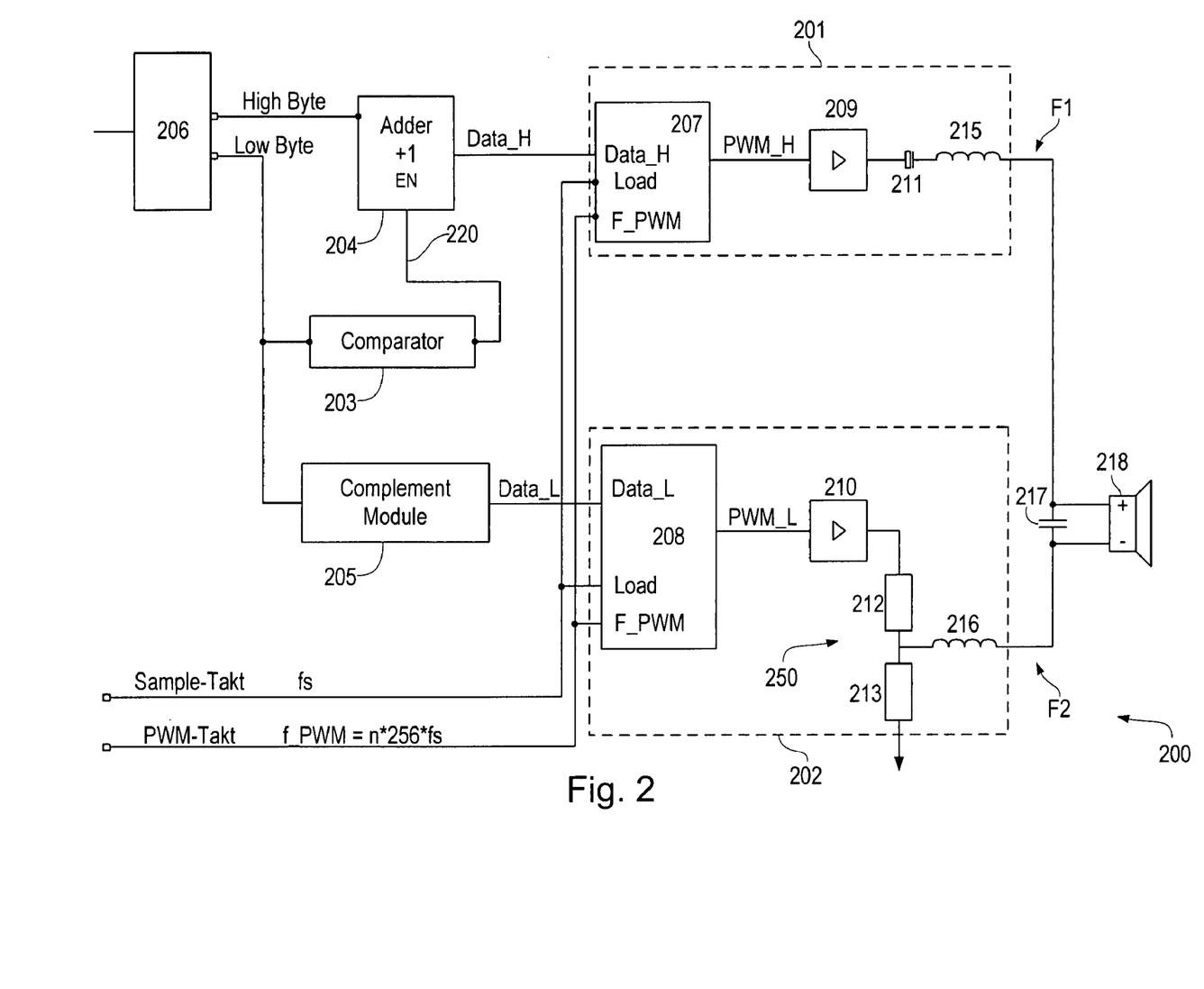
FIG. 2 is a block diagram illustrating one example of a loudspeaker control circuit.

FIG. 2 is a block diagram of a loudspeaker control circuit 200 that may be used to process a digital audio signal to an analog audio signal. An analog audio output is produced at a loudspeaker 218 from the analog audio signal. The loudspeaker 218 may include different sized loudspeakers such as a small loudspeaker disposed in a digital headphone. Other sized loudspeakers may be used such as larger home or concert sized speakers. Dynamic loudspeakers, piezoelectric sound converters and capacitor converters are suitable as loudspeakers. Dynamic loudspeakers operate with moving coils in the magnetic field generated by a magnet. The loudspeaker control circuit 200 may include two D/A converters 201 and 202. An output of the D/A converter 201 connects a positive terminal of the loudspeaker 218, and an output of the D/A converter 202 is coupled to a negative terminal of the loudspeaker 218. The loudspeaker control circuit 200 also includes an adder 204, a comparator 203 and a complement module 205, which are described in detail below. By way of example, in the loudspeaker control circuit 200, a 16-bit digital-to-analog conversion takes place at a conversion rate of about 48 kHz along with the necessary power amplification.

As discussed above, a data item representing the digital audio signals is provided to the loudspeaker control circuit 200. The data item may be divided into a plurality of bit groups. For example, the data item is divided into a high order bit group and a low order bit group. By way of example, the digital audio signals may be split into a high-order 6-bit bit group and a low order 6-bit bit group.

Digital audio signals may be divided into other numbers of bit groups such as three bit-groups. For example, a 16-bit data item may be split into three groups. The six highest bits are converted into a 6-bit group, the nine lowest bits are converted into a 9-bit group and the seven middle bits are converted into a 7-bit group. The 7-bit group may overlap with the two other bit groups at both the low and high bit ends. Each divided bit group is converted into analog signals. Digital-to-analog ("D/A") converters separately convert each bit group into analog signals.

The analog signals of each group may be combined with each other. Alternatively, or additionally, the converted analog signals may be transmitted to switching sections, which may function as amplifiers. The amplifiers operate to weigh the converted analog signals with respect to one another. For example, the ratio of weight may be 64:1. Further, the converted analog signals may be summed according to a weighing process using resistors of different resistance. The amplified and/or weighted signals may be sent to a loudspeaker. Resulting audio signals may be reproduced at the loudspeaker.

The loudspeaker control circuit 200 includes a bit splitter 206. The bit splitter 206 splits a width of 16-bit data item into a high byte (8 bits) and a low byte (8 bits). Various other widths of the data item are possible. The data item also may be split into three or more groups. Data items with various resolutions such as 8, 18, 24, 32 bits, etc. may be split by the bit splitter 206. The data item may be split into a bit group with half a word width. The data items may be split into two bit groups having two different widths. For example, an 18 bit sequence may be split into a high order bit group, 11-bits wide, and a low order bit group, 7-bits wide. Arbitrary data lengths are possible.

The splitting of the data item may be performed as follows. The data item is divided by 256, which is the possible valences of a byte. The whole-number may be the high byte and the remainder may be the low byte. In a mathematical representation, the high byte and the low byte may be described as follow:

$$\text{High byte} = \text{Data item div } 256 \quad (1)$$

$$\text{Low byte} = \text{Data item mod } 256 \quad (2)$$

Alternatively, $$\text{Data item} = \text{High byte} \times 256 + \text{Low byte} \quad (3)$$

In some cases, the data items may be already formatted in a desired form. In a parallel form, the data item may be compatible with a digital signal processor, a microcontroller and a storage device. The 16-bit data items may be directly loaded into a device such as a 16-bit register, two 8-bit RAM storage devices and an FPGA (field programmable gate array). To form a plurality of data groups, the parallel data bits may be connected and branched into a low byte and a high byte as shown in FIG. 3.

Figure 3:
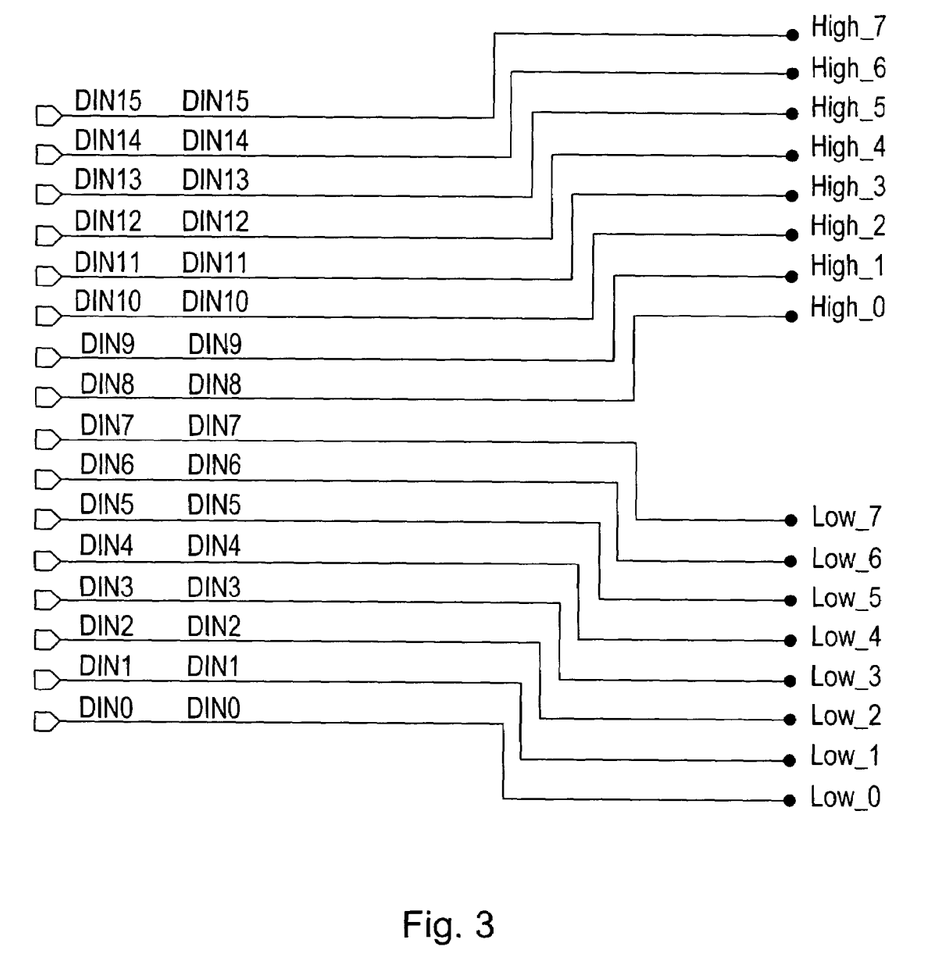
FIG. 3 is a schematic of one example of dividing a bit sequence of a data item.

FIG. 3 illustrates division or bit-splitting of a 16-bit data item with hardware. The 16-bit data item includes a 16 bit sequence, DIN0~DIN15. The 8 bit sequence, DIN0~DIN7 is grouped as a low byte (Low_0~Low_7) and the remaining 8 bit sequence, DIN8~DIN15 is grouped as a high byte (High_0~High_7). Various other implementations for the bit-splitting are possible such as software implementation. For example, a DSP or microcontroller may be configured to divide the data item with a suitable combination of mask, shift, and move operations.

Alternatively, or additionally, the data item may be presented in a serial format. For the data item in the serial format, a bit splitter may include a serial-to-parallel (S/P) converter, which produces a parallel data flow out of the serially formatted data item. The parallel data flow is then split into at least two groups, for example, as shown in FIG. 3. The design of the S/P converter varies depending on serial protocols.

In FIG. 2, the high bytes may be processed by the D/A converter 201. The D/A converter 201 includes a digital modulator. The digital modulator may have the same resolution as that of each bit group. The digital modulator converts the digital signal into a bit stream so that an average value of the bit stream corresponds to the converted data. In other words, the binary amplitude information may be coded in the average value of the bit stream. Alternatively, or additionally, the signal may be formed and modulated with respect to a pulse density. Modulation methods such as pulse width modulation (PWM) or sigma delta modulation (SDM)

are suitable. Various digital modulators are possible as long as the average value of the resulting bit stream represents the data to be converted.

The D/A converter 201 includes a pulse width modulation ("PWM") module 207. The high byte arrives at the data input of the PWM module 207 via an adder 204. The adder 204 is disposed between the bit splitter 206 and the PWM module 207. The adder 204 may add 1 to the high byte. If the low byte is not equal to 0, the adder 204 adds 1 to the high byte. The high byte remains the same if the low byte is equal to 0. The operation of the adder 204 is to compensate for the effect of 2's complement representation of the low byte, which will be described in detail below.

A comparator 203 is disposed between the bit splitter 6 and the two D/A converters 201 and 202. The comparator 203 may be an 8 bit comparator. Various other comparators with different bit sequence numbers are possible depending on the bit sequence divided by the bit splitter 206. The comparator 203 generates an output signal depending on whether the low byte is larger than 0 (the low byte>0) or the low byte is equal to 0 (the low byte=0). An output of the 8 bit comparator 203 is an input to the adder 204. The comparator 203 provides a comparison result to the adder 4 via a line 220. The adder 204 increases the high byte by 1 if the output signal of the comparator 203 is "1." If the output signal of the comparator 203 is not "1," the high byte passes through the adder 204 and arrives unchanged at the data input of the PWM module 207. Accordingly, the comparator 203 may provide the output signal, "1" when the low byte is not equal to 0. The comparator 203 also may provide the output signal, "0" when the low byte is equal to 0.

The adder 204 and the comparator 203 may be implemented with a standard logic gate or a programmable logic. The standard logic gate may include 74HC283, 74HC85, 74HC04, etc. The programmable logic may include an FPGA.

The PWM module 207 may include an 8 bit counter and an 8 bit comparator. The PWM module 207 converts the high byte directly into a PWM signal. The PWM signal has a fixed base frequency and a variable pulse width. The variable pulse width represents the binary amplitude of the original signal. This PWM signal is amplified with an amplifier 209. The amplifier connects to a positive terminal of the loudspeaker 218 via a capacitor 211 and an inductor 215. The amplifier 209 may be implemented, for example, with CMOS buffers, analog multiplexers, conduction drivers, impedance converters and rail-to-rail operation amplifiers. For example, the amplifier may be a class D amplifier.

Figure 4:
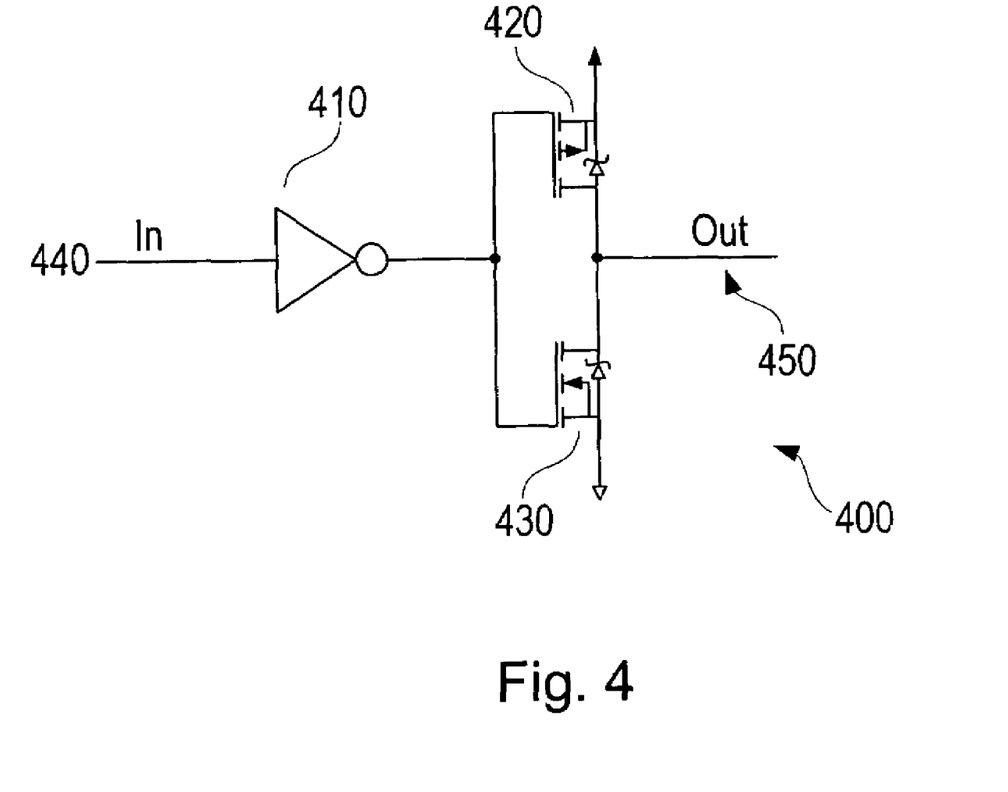
FIG. 4 is a circuit diagram of an amplifier implemented with a MOSFET (Metal Oxide Semiconductor Field Effect Transistor).

Alternatively, or additionally, the amplifier 209 may be implemented with a MOSFET (Metal Oxide Semiconductor Field Effect Transistor). FIG. 4 illustrates a MOSFET single-ended, push-pull output stage 400 with an inverter that implements the amplifier 209 of FIG. 2. The output stage 400 includes an inverter 410 combined with a P channel MOSFET 420 and an N channel MOSFET 430. An input terminal 440 is coupled to the inverter 410 and an output of the inverter 410 is connected to the N channel MOSTET 430 and to the P channel MOSFET 420. An output 450 of the output stage 400 may be connected to the capacitor 211 of FIG. 2.

In FIG. 2, the amplifier stage 209 may be integrated with the D/A converter 207. The amplifier 209 may be designed in the form of a digital amplifier such as a pulse amplifier. The digital amplifier may work with a digital modulator such as a sigma-delta modulator. The digital amplifier may improve efficiency and reduce signal distortions.

The amplifier 209 may operate as a buffer stage. The signal that passes through the buffer stage does not change the polarity and the buffer stage may be non-inverting for that reason. Output impedance of the buffer stage may need to be smaller than an impedance of the loudspeaker capsule 218. For example, the output impedance may be smaller than the impedance of the loudspeaker capsule 218 by $1/2000 \sim 1/10$.

The loudspeaker capsule 218 may include two terminals, a positive terminal and a negative terminal. The loudspeaker capsule 218 includes a diaphragm that moves in response to a movement of voice coils. When a current flows, a magnet generates the magnetic field which causes the voice coils to move. One end of the diaphragm is connected to the voice coils, so that the movement of the voice coils directly causes the diaphragm to move. The positive terminal may be designated such that the diaphragm is moved outwardly during the inflow of the current. The negative terminal may be designated such that the diaphragm is moved inwardly during the inflow of the current. The designation of the positive and negative terminals identifies phase positions of audio signals with two or more channels.

The complement module 205 is connected to the D/A converter 202 which in turn connects to the negative terminal of the loudspeaker capsule 218. The D/A converter 202 includes a PWM module 208, an amplifier stage 210, and a voltage divider 250. The voltage divider 250 includes two resistors 212 and 213. The complement module 205 may complement the low byte. This complement may be needed because a resulting analog signal is provided at the negative terminal of the loudspeaker 218. An output signal of the complement module 205 is connected to a data input of a PWM module 208. The PWM module 208 also may include an 8 bit counter and an 8 bit comparator. The signal generated from the PWM module 208 is amplified at the amplifier 210. The voltage divider 250 may attenuate the amplified signal by a factor of 256. The factor of 256 stems from the number of bit sequence of the high byte. In FIG. 2, the high byte has the 8 bit sequence and the factor of 256 corresponds to $2^8$. The resulting PWM signal with the 1/256 fold amplitude is provided to the negative terminal of the loudspeaker 218 via an LC filter 216 and 217.

As described above, if the low byte is not equal to 0, the adder 204 adds 1 to the high byte. The addition may occur in light of overload in connection with the 2's complement. The 2's complement method represents a negative number in digital signal processing. Other methods for representing a negative number include the sign magnitude method and the 1's complement method. The 2's complement method inverts a positive number bitwise and adds 1 to the inverted number. The 2's complement method obtains a positive number representation from a negative number representation. An advantage of the 2's complement method is that there is only one value of 0. The sign magnitude method has two values of 0, i.e., +0 and −0.

The complement module 205 complements the low byte with the 2's complement representation. The low byte is inverted bitwise and 1 is added thereto. The high byte is provided to the positive terminal of the loudspeaker capsule 118. The addition of "1" to the high byte represents compensation. The compensation is explained as voltage applied to the loudspeaker capsule 118. The voltage $V_{Loudspeaker(+)}$ at the positive terminal of the loudspeaker may be determined as:

$$V_{Loudspeaker(+)} = ((DI \text{ div } 256)+1) \times Ub/256),$$

where low byte ($DI$ mod 256)>0 \hfill (4)

$$V_{Loudspeaker(+)} = (DI \text{ div } 256) \times Ub/256,$$

where low byte $(DI \bmod 256) = 0$ \hfill (5)

Ub is the supply voltage of the amplifiers 209 and 210 acting as buffers. The voltage at the negative terminal of the loudspeaker capsule 218 may be determined as:

$$V_{Loudspeaker(-)} = (256 - (DI \bmod 256)) \times Ub/(256 \times 256) \quad (6)$$

The difference between the two voltages at the loudspeaker 218 is:

$$V_{Loudspeaker(+)} - V_{Loudspeaker(-)} = DI \times Ub/(256 \times 256) \quad (7)$$

The voltage difference in the equation (7) indicates the 16-bit conversion. As noted above, the data item is also the 16-bit digital audio signal. Prior to the modulation by the PWM module 208, the low order bits are complemented with the 2's complement formation. As a result, a differential voltage, which corresponds to the converted data value, is formed and provided between the loudspeaker terminals. This differential voltage has the 16-bit conversion, which corresponds to the data item prior to the division or splitting of the data item.

The high-order and low-order bit groups may be generated in various other ways. To simplify the implementation of the circuit, bits of the low-order bit group may be complemented without the simultaneous increment of the high-order bit group. Alternatively, or additionally, in place of a low order bit group, a high order bit group may be complemented. The 1's complement method may be used in place of the 2's complement.

The high byte and the low byte are transmitted into the PWM modules 207 and 208 with a sample cycle fs. The high byte and the low byte are fed to the internal 8-bit counter of the PWM modules 207 and 208 with the cycle, f_PWM.

$$f\_PWM = 256 \times m \times fs \quad (8)$$

where m is an integer, for example, 4. The value of m determines the ratio of the frequency of the PWM module to the sample cycle. By using the counter cycle, f_PWM, a surge is not produced due to the periodic update of the PWM value with the sample cycle fs. The higher the counter cycle is, the more may the basic PWM frequency be attenuated by LC filters F1 and F2. The LC filter F1 includes an inductor 215 and the capacitor 217. This LC filters F1 and F2 may be a low pass filter and placed prior to the loudspeaker capsule 218. The input is dimensioned so that with the upper audio limit frequency of approximately 20 kHz, the audio signal may be attenuated by 3 dB.

The output signal PWM_H of the PWM module 207 is amplified with the amplifier 209 and transmitted via the capacitor 211 and the inductor 215 to the positive terminal of the loudspeaker capsule 218. The inductor 215 is, for example, a coil and acts as a low pass filter with the capacitor 211 to filter out undesirable direct voltage fractions. The output signal PWM_L of the PWM module 208 is amplified with the amplifier 210 and transmitted to the voltage divider 250. The amplifiers 209 and 210 raise the output signals PWM_H and PWM_L to a suitable level to drive low load, for example, of the loudspeaker 218.

The voltage divider 250 weights the signal by the factor of 256. This factor corresponds to powers of 2, for example, $2^8$, $2^6$, etc., where powers such as 8, 6, etc. are the width of the high order bit group. By way of example, the resistor 212 is 2.55 kΩ and the resistor 213 is 10 Ω. This PWM signal of small amplitude arrives at the negative terminal of the loudspeaker 218 via the inductor 216. The resistance values of the resistors 212 and 213 indicate that the load due to the filtering or loudspeaker impedance is negligibly small. The ratio of the resistors 212 and 213 may be selected to adjust the level of the PWM signal. For instance, the ratio is selected so that in the loaded state, the level of the PWM signal for the low byte is smaller by a factor of 256 than the PWM signal for the high byte. The voltage division ratio by the voltage divider 250 is a factor of ½₅₆ based on the resistance of 2.55 KΩ and 10Ω of the resistors 212 and 213.

The capacitor 217 is connected between the positive and negative terminals of the loudspeaker capsule 218. The capacitor 217 may form a low pass filter F1 with the inductor 215 and a low pass filter F2 with the inductor 216. The low pass filters F1 and F2 filter the amplified PWM signal to produce an analog signal. High frequency components of the PWM signal may be greatly attenuated as a result of low pass filtering.

The longer bit sequence of the high order bit group than the lower order bit group may be desirable in light of the cycle of the digital modulator such as the PWM modules 207 and 208. The longer bit sequences may reduce influence of resistance tolerances. The resistance tolerances may attenuate the low order bit sequences. The amplifiers 209 and 210 may differentiate amplification levels of signals from the high order bit group and the low order bit group to produce the desired ratio at the loudspeaker capsule 218. The resistance tolerances relate to the voltage divider 250 having the resistors 212 and 213.

The implementation of the loudspeaker control circuit 200 may vary. The loudspeaker control circuit 200 may be implemented with hardware or software. For instance, the loudspeaker control circuit 200 may be directly implemented on chip with a modern DSP (digital signal processors), RISC (reduced instruction set computer) microcontrollers, etc. The loudspeaker control circuit also may be implemented in an FPGA (field programmable gate array) or an ASIC (application specified integrated circuit). Data which is loaded with the sample cycle fs into the PWM modules may be computed with hardware such as the ASIC and the FPGA or software such as the DSP or microcontrollers. The number of integrated chips and component cost may be substantially reduced with such techniques. An I²S (Inter-IC Sound) interface may not be needed, which is an electrical bus interface standard used for connecting digital audio devices together.

Figure 5:
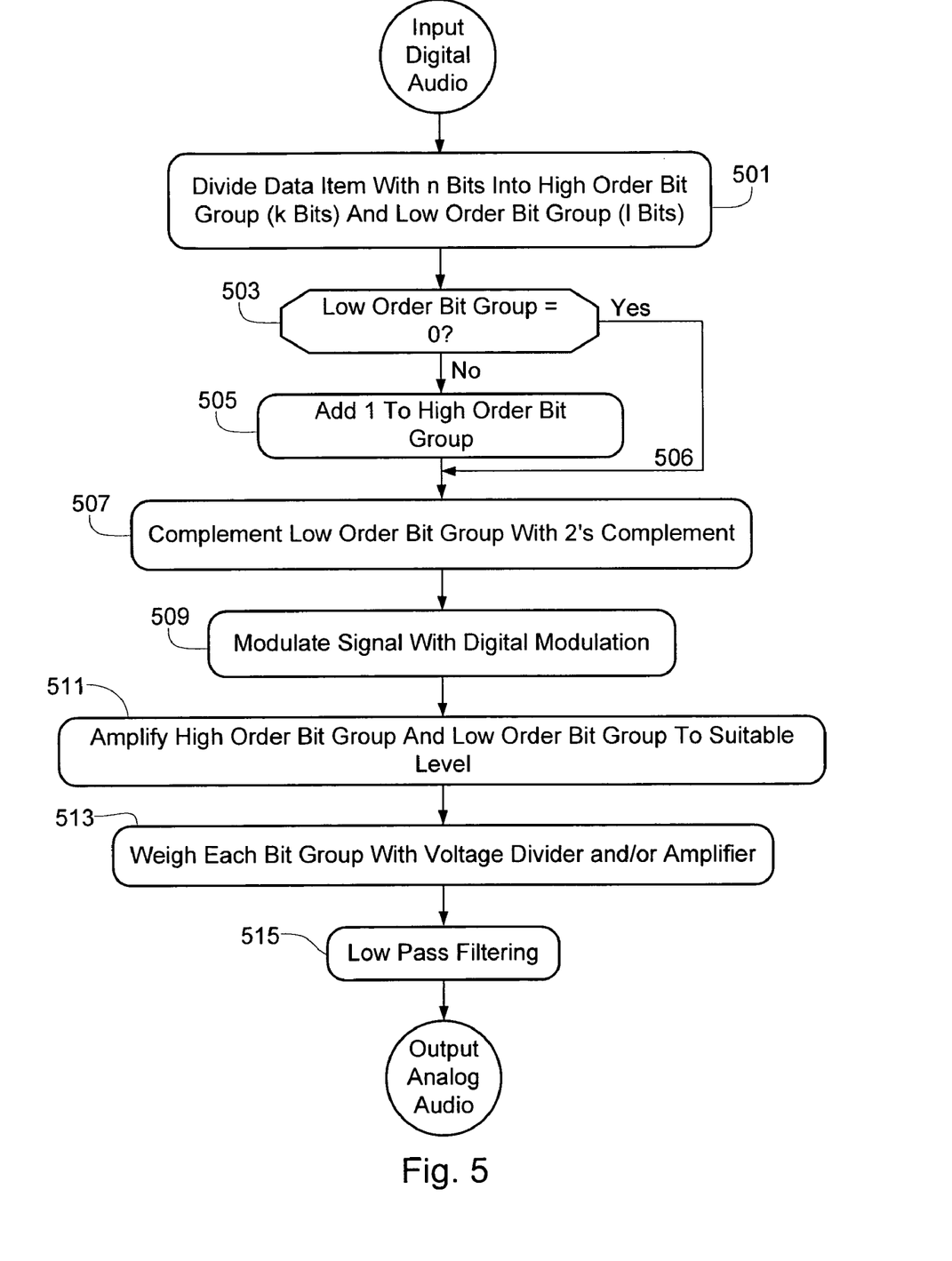
FIG. 5 is a flowchart illustrating a loudspeaker control method.

FIG. 5 is a flowchart illustrating a loudspeaker control method. A digital audio signal is an input data item. The digital audio signal is represented with an n bit sequence and n may be, for example, 4, 8, 16, etc. The digital audio signal is divided into two or more groups (501). For example, the digital audio signal is divided into a high order bit group and a low order bit group (501). The high order bit group has a k bit sequence and the low order bit group has an l bit sequence. The bit sequence numbers, k and l, may be equal when each bit group has a half width of the n bit sequence of the digital audio signal. The bit sequence numbers, k and l may be different so that k is greater than l, or vice versa. It may be desirable to have the relation, k>l because the smaller low order bit group may reduce the influence of a tolerance of resistance.

A comparator determines whether the low order bit group is equal to 0 (503). Upon determination of the value of the low order bit group, the high order bit group may net be changed. If the value of the low order bit group is not 0, an adder adds 1 to the high order bit group (505). If the value of the low order bit group is equal to 0, the high order bit group remains unchanged (506). The low order bit group may be coupled to a negative terminal of a loudspeaker. Accordingly, the low order bit group is complemented with the 2's complement representation (507). The high order bit group may be complemented in place of the low order bit group. Further, the 1's complement representation may be used to complement one of the bit groups. With the 1's complement representation, the determination of the value of the low order bit group and addition of 1 (503 and 505) may not be needed. As noted above, the 2's complement representation adds 1 subsequent to the inversion of each bit. Thus, addition of 1 (505) may be needed to compensate the high order bit group when the low order bit group is complemented with the 2's complement representation.

The high order bit group and the low order bit group are input to a digital modulator. As noted above, the digital modulator may include a pulse width modulation module or a pulse density modulation module (509). The digital modulator may include other types of modulators such that the average value of the modulated signal represents the binary amplitude of the original signal. After the modulation, the high order bit group and the low order bit group may be amplified (511) to a suitable level for the output. Various types of an amplifier may be used. The amplifier also may operate as a buffer (511). The high order bit group or the low order bit group, or both, may be processed to be weighted (513). A voltage divider and the amplifier may be used to process the weighted bit group. The voltage divider may include resistors that generate a ratio of $2^k$ where k is the number of bit sequences of the high order bit group. The weighted bit group may be filtered by a low pass filter (515). The low pass filter may eliminate direct voltages. The low pass filter may include an inductor and a capacitor. The capacitor may be placed between two terminals of the loudspeaker and the capacitor may be engaged in the filtering of the high order bit group and the low order bit group. As a result, an analog audio signal is output at the loudspeaker.

The loudspeaker control circuit has advantages that a differential voltage corresponding to the converted data items is directly formed between the loudspeaker terminals. The overlapping and combination of the two bit groups are not needed. Regular small loudspeaker capsules may be used. The loudspeaker capsules may include a loudspeaker reel, piezoelectric sound converters and capacitor loudspeakers. Sound converters are not needed to be specially adapted to the loudspeaker control circuit. This may reduce production cost and permit universal applicability. The digital amplifier is used so that power consumption may be kept low in comparison to analog amplifiers. The number of components required for the loudspeaker control circuit is also reduced with flash DSPs. An I²S interface may not be needed. Use of the DSP or microcontroller supporting PWM outputs allows a direct control of the loudspeaker, thereby producing HiFi quality sound. Power consumption may be reduced for devices with a high degree of integration.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A loudspeaker control circuit, comprising:
   a bit splitter that divides a data item into a high order bit group and a low order bit group where the data item represents an acoustic signal;
   a complement module that determines a complement of the low order bit group to provide a complemented bit group; and
   a digital-to-analog converter connected in series with the complement module and converting the high order bit group and the low order bit group from a digital format to an analog format.

2. The circuit of claim 1, where the digital-to-analog converter comprises a first digital-to-analog converter that converts the high order bit group to analog and a second digital-to-analog converter that converts the low order bit group to analog.

3. The circuit of claim 2, where the complement module is connected in series with the second digital-to-analog converter and complements the low order bit group to create a complemented low order bit group where the second digital-to-analog converter converts the complemented low order bit group to analog.

4. The circuit of claim 3, further comprising a loudspeaker capsule to receive an output signal from the first digital-to-analog converter and the second digital-to-analog converter where the output signal represents the data item prior to the division by the bit splitter.

5. The circuit of claim 4, where the loudspeaker capsule comprises a positive terminal and a negative terminal having a capacitor provided therebetween.

6. The circuit of claim 1, where the digital-to-analog converter comprises a digital modulator, an amplifier stage that is downstream to the digital modulator, and a low pass filter that is downstream to the amplifier.

7. The circuit of claim 6, where the digital modulator comprises a pulse width modulation module.

8. The circuit of claim 7, where the pulse width modulation module is integrated on one chip with one of a digital signal processor and a reduced instruction set computer controller.

9. The circuit of claim 7, where the pulse width modulation module is implemented in one of a field programmable gate array and an application specified integrated circuit.

10. The circuit of claim 6, where the amplifier stage comprises a MOSFET push-pull output stage with an inverter.

11. The circuit of claim 6, where the low pass filter comprises an inductor and a capacitor.

12. The circuit of claim 1, where the digital-to-analog converter comprises a device that performs weighting of the low order bit group.

13. The circuit of claim 12, where the device weighs the low order bit group by a factor of $\frac{1}{2}^k$ and k corresponds to a word width of the high order bit group.

14. The circuit of claim 12, where the device comprises a voltage divider comprising at least two resistors.

15. The circuit of claim 12, where the device comprises an amplifier.

16. The circuit of claim 1, further comprising an adder operable to add a value of one to the high order bit group upon determination of a value of the low order bit group.

17. The circuit of claim 16, further comprising a comparator operable to determine the value of the low order bit group and provide the value to the adder.

18. An audio signal processing system, comprising:
    a pre-conversion stage to receive an input audio signal in a digital format, the pre-conversion stage comprising a bit splitter that divides the input audio signal into a high byte group and a low byte group and a complement module that represents the low byte group with one of a 1's complement and a 2's complement;

a conversion stage operable to convert the input audio signal to an output audio signal in an analog format, the conversion stage comprising:
   a modulation stage that converts the input audio signal into a pulse stream having a variable average value;
   a weighting stage that processes the pulse stream a weighted signal; and
   a filtering stage that eliminates a predetermined frequency range of the weighted signal; and
an output stage operable to output the audio signal in the analog format.

19. The system of claim 18, where the conversion stage further comprises an amplification stage that operates to amplify the pulse stream to a suitable level for the output stage.

20. The system of claim 18, further comprising a loudspeaker capsule including a positive terminal and a negative terminal where the output signal comprises a differential voltage applied to the positive terminal and the negative terminal and the differential voltage represents an analog conversion of the input audio signal prior to the division.

21. A loudspeaker control method comprising:
   dividing a digital audio signal into a high order bit group and a low order bit group;
   determining a complement of the low order bit group;
   converting a complemented bit group and a remaining bit group to an analog signal; and,
   applying the analog signal from the complemented bit group to a negative terminal of a loudspeaker capsule and the analog signal from the remaining bit group to a positive terminal of the loudspeaker capsule.

22. The method of claim 21, further comprising converting each bit group into a bit stream where an average value corresponds to the binary amplitude information of the digital audio signal.

23. The method of claim 22, further comprising amplifying the bit stream.

24. The method of claim 23, further comprising filtering the amplified bit stream.

25. The method of claim 21, further comprising weighting the low order bit group with a factor of $\frac{1}{2}^k$ relative to the high order bit group where k is a word width of the high order bit group.

26. The method of claim 21, where the determining the complement comprises determining the complement of the low order bit group with a 1's complement representation.

27. The method of claim 21, where the determining the complement comprises determining the complement of the low order bit group with a 2's complement representation.

28. The method of claim 21, further comprising adding a value of one to the high order bit group upon determination that the low-order bit group is other than a value of zero.

* * * * *